US 9,823,530 B2

(12) United States Patent
Sugimoto

(10) Patent No.: US 9,823,530 B2
(45) Date of Patent: Nov. 21, 2017

(54) ELECTRO-OPTICAL APPARATUS AND ELECTRONIC APPARATUS

(71) Applicant: Seiko Epson Corporation, Tokyo (JP)

(72) Inventor: Yohei Sugimoto, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/060,456

(22) Filed: Mar. 3, 2016

(65) Prior Publication Data
US 2016/0291434 A1    Oct. 6, 2016

(51) Int. Cl.
| H01L 29/786 | (2006.01) |
| G02F 1/1362 | (2006.01) |
| G02F 1/1368 | (2006.01) |
| H01L 27/32 | (2006.01) |

(52) U.S. Cl.
CPC ...... G02F 1/136227 (2013.01); G02F 1/1368 (2013.01); H01L 27/3272 (2013.01); H01L 29/786 (2013.01); H01L 29/78633 (2013.01)

(58) Field of Classification Search
CPC .............. H01L 29/78633; H01L 27/3272
See application file for complete search history.

(56) References Cited

U.S. PATENT DOCUMENTS 5,567,575 A * 10/1996 Hirama ............... G03F 7/70475
                                                   430/312
5,694,189 A * 12/1997 Nakamura ........ G02F 1/133371
                                                    349/10
2002/0008814 A1    1/2002 Honbo et al.

FOREIGN PATENT DOCUMENTS

| JP | 2001-356371 A | 12/2001 |
| JP | 2003-307725 A | 10/2003 |
| JP | 2010-117399 A | 5/2010 |

* cited by examiner

*Primary Examiner* — Amar Movva
(74) *Attorney, Agent, or Firm* — ALG Intellectual Property, LLC

(57) ABSTRACT

An electro-optical apparatus includes a semiconductor layer which is provided on a first substrate, a gate electrode which is provided on the semiconductor layer, a first light-shielding member which is provided between the semiconductor layer and the first substrate, a second light-shielding member which is provided in an extension direction of the first substrate in the semiconductor layer, and a third light-shielding member which is provided on an opposite side to the first substrate in the semiconductor layer, in which the second light-shielding member is embedded within a groove which is formed between the first light-shielding member and the third light-shielding member, and the third light-shielding member is electrically connected to the gate electrode and the first light-shielding member via the second light-shielding member.

11 Claims, 11 Drawing Sheets

ELECTRO-OPTICAL APPARATUS AND ELECTRONIC APPARATUS

BACKGROUND

1. Technical Field

The present invention relates to an electro-optical apparatus and an electronic apparatus.

2. Related Art

For example, an active drive system liquid crystal device which is provided with a transistor, that switch controls a pixel electrode, in each pixel is known as the electro-optical apparatus. For example, the liquid crystal device is used as a liquid crystal projector liquid crystal light valve as an electronic apparatus.

Since light leakage (current) of a transistor tends to increase accompanying the high luminance of the liquid crystal projector, in order to maintain display quality a light shielding structure on the periphery of a semiconductor layer which configures the transistor becomes important.

Here, in JP-A-2010-117399 (refer to FIG. 14) and JP-A-2001-356371, a technique is disclosed in which light from a semiconductor layer 102 (for example, a lightly doped drain (LDD) region) is shielded by a groove 103 being formed on the periphery of the semiconductor layer 102, and a metallic film 104 being formed on a side wall of the groove 103. FIG. 14 is an outline sectional view illustrating a structure of a liquid crystal device 101 of the related art.

The liquid crystal device 101 which is shown in FIG. 14 is provided, in order from a substrate 105 side, with a first scanning line 106, a first interlayer insulation layer 107, the semiconductor layer 102, a gate insulation film 108, a second scanning line 109 (104) which also serves as a gate electrode, a second interlayer insulation layer 110 and a light-shielding film 111. The second scanning line 109 is electrically connected to the first scanning line 106 via the groove 103 which passes through the gate insulation film 108 and the first interlayer insulation layer 107.

However, in JP-A-2010-117399 (refer to FIG. 14) and JP-A-2001-356371, there is a problem in that although the metallic film 104 is formed on a side wall of the groove 103, since there is a space within the groove 103, light scattering occurs, and a light-shielding property is not sufficient due to the material that the metallic film 104 is formed of. In addition, there is a problem in that a distance from the semiconductor layer 102 to the light-shielding film 111 is great, and it is difficult to suppress light leakage.

SUMMARY

The invention can be realized in the following aspects or application examples.

Application Example 1

According to this application example, there is provided an electro-optical apparatus including a substrate, a third light-shielding member which is provided above the substrate, a transistor which is provided between the third light-shielding member and the substrate, a first light-shielding member which is provided between the transistor and the substrate, a second light-shielding member which is provided within groove that is provided between the first light-shielding member and the third light-shielding member at least at both sides of the transistor and electrically connects the first light-shielding member and the third light-shielding member.

According to this application example, since the second light-shielding member is embedded within the groove, it is possible to increase a light-shielding property in comparison to a case in which the light-shielding member is formed on the side wall of the groove. In addition, since there is no gap within the groove, it is possible to suppress occurrence of stray light. Additionally, since the third light-shielding member is electrically connected to the first light-shielding member via the second light-shielding member, it is possible for a portion of the periphery of at least a semiconductor layer of the transistor to completely shield light from light leakage using the first light-shielding member, the second light-shielding member, and the third light-shielding member.

Application Example 2

In the electro-optical apparatus according to the application example, preferably the third light-shielding member has a higher light-shielding property than a gate electrode of the transistor and the second light-shielding member.

According to the application example, the third light-shielding member has a higher light-shielding property than the gate electrode and the second light-shielding member, in other words, it is possible to cover the periphery of the semiconductor layer which has a high light-shielding property due to the second light-shielding member using a material which is easier to embed within a groove, and the third light-shielding member using a material with a higher light-shielding property. Consequently, it is possible to shield light from light leakage.

Application Example 3

In the electro-optical apparatus according to the application example, preferably the second light-shielding member is tungsten, and the third light-shielding member is aluminum.

According to the application example, it is possible to improve the light-shielding property by embedding tungsten with a high embedding property within the groove and selecting aluminum on the upper section by selecting the material in the second light-shielding member and the third light-shielding member. Consequently, it is possible to improve the light-shielding property with respect to light leakage.

Application Example 4

In the electro-optical apparatus according to the application example, preferably the third light-shielding member is a scanning line.

According to the application example, it is possible to reduce electrical resistance by using the third light-shielding member (aluminum) as the scanning line and even in a case where the pixel number is great, it is possible to speed up a writing speed.

Application Example 5

In the electro-optical apparatus according to the application example, preferably a first contact hole which is electrically connected to one of a source and a drain of the transistor and a second contact hole which is electrically connected to the other of the source and the drain are included, and the height of the first contact hole and the second contact hole is formed up to the height of at least the third light-shielding member.

According to the application example, since the first contact hole and the second contact hole which are connected to the one or the other of the source or drain are disposed, it is possible to improve the light-shielding property in a source and drain direction in the semiconductor layer (an extension direction of the semiconductor layer).

Application Example 6

According to this application example, there is provided an electronic apparatus including the electro-optical apparatus.

According to this application example, since the electro-optical apparatus is provided, it is possible to provide the electronic apparatus which is able to improve display quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments which embody the invention will be described below with reference to the drawings. Here, the drawings which are used are displayed by appropriately enlarging and shrinking such that the portion which is described is in a recognizable state.

Here, in the embodiments below, for example, a case where "on a substrate" is described, a case of disposing so as to come into contact on the substrate, a case of disposing on the substrate via another construction, a case of disposing a portion so as to come into contact on the substrate, or a case where a portion is disposed via another component are represented.

In the present embodiment, an example of an active matrix-type liquid crystal device which is provided with a thin film transistor (TFT) that is given as an example of a switching element will be described. For example, the liquid crystal device is able to be appropriately used as a light modulation element (liquid crystal light valve) of a projection-type display device (liquid crystal projector) which will be described later.

Configuration of Liquid Crystal Device as Electro-Optical Apparatus

Figure 1:
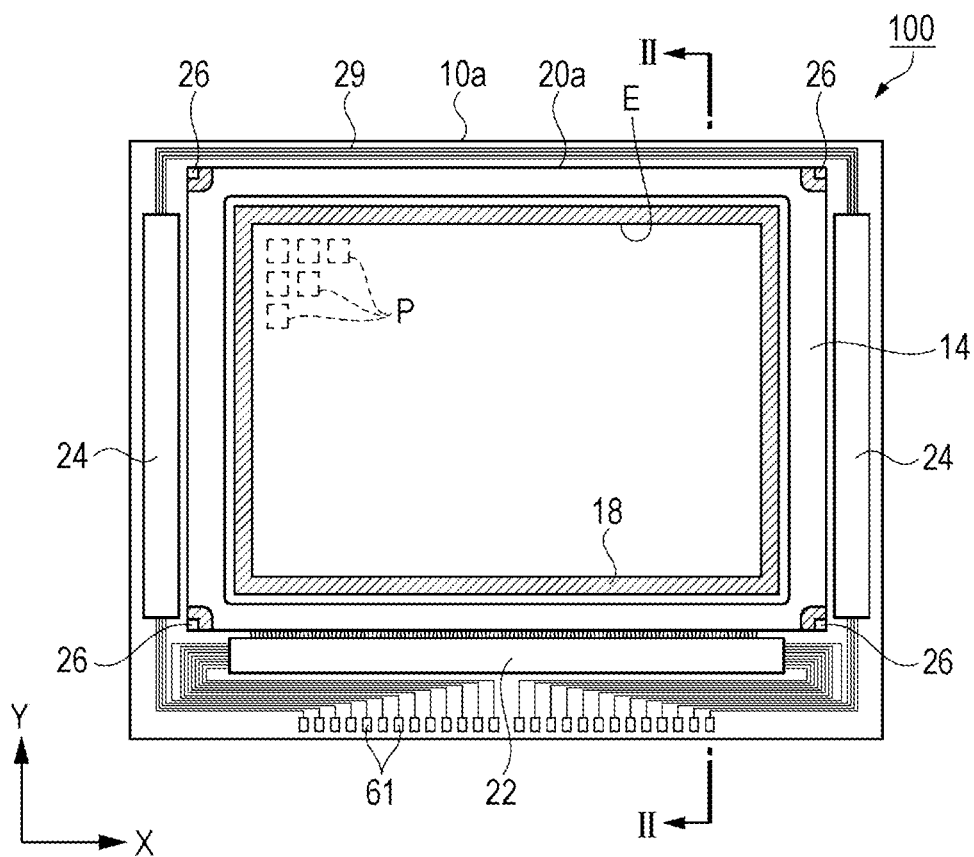
FIG. 1 is a schematic planar view illustrating a configuration of a liquid crystal device.
Figure 2:
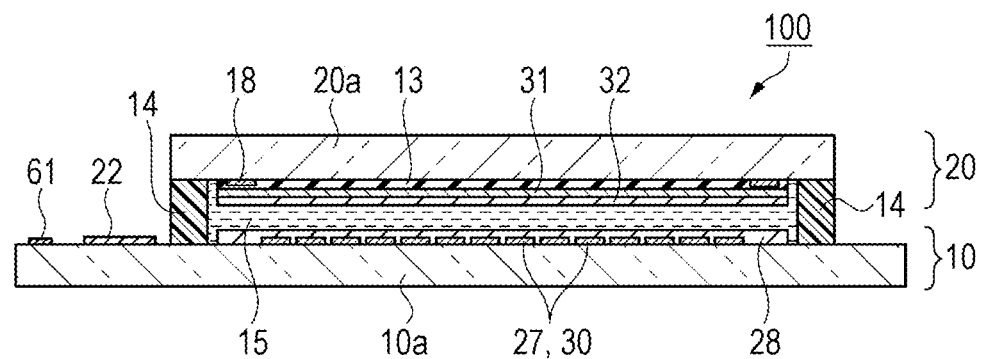
FIG. 2 is a schematic sectional view along line II-II of the liquid crystal device which is illustrated in FIG. 1.
Figure 3:
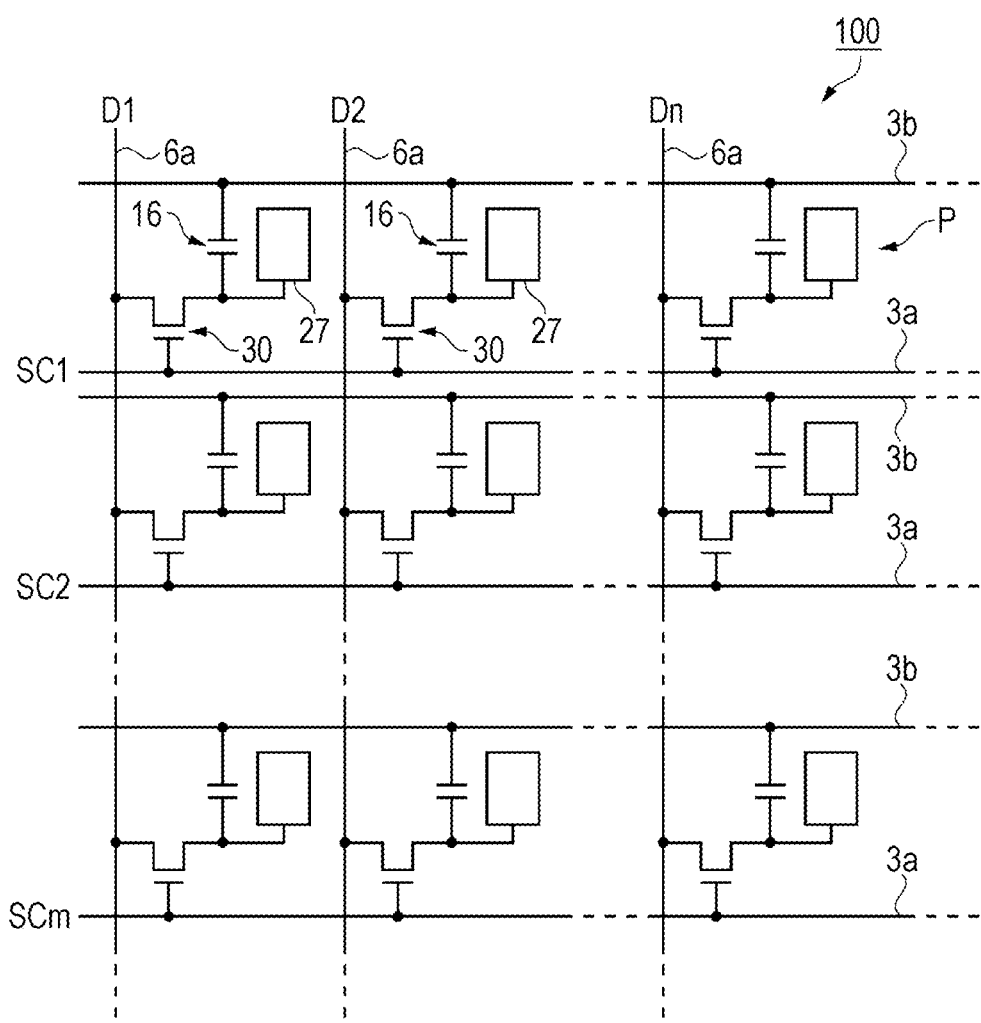
FIG. 3 is an equivalent circuit diagram illustrating an electrical configuration of the liquid crystal device.

FIG. 1 is a schematic planar view illustrating a configuration of the liquid crystal device. FIG. 2 is a schematic sectional view along line II-II of the liquid crystal device which is illustrated in FIG. 1. FIG. 3 is an equivalent circuit diagram illustrating an electrical configuration of the liquid crystal device. Configurations of the liquid crystal device will be described below with reference to FIGS. 1 to 3.

As shown in FIGS. 1 and 2, a liquid crystal device 100 of the present embodiment has an element substrate 10 and an opposing substrate 20 which are disposed facing each other, and a liquid crystal layer 15 which is interposed by the pair of substrates. A first substrate 10a as a substrate which configures the element substrate 10 and a second substrate 20a which configures the opposing substrate 20 use, for example, a transparent substrate such as a glass substrate or a quartz substrate.

The element substrate 10 is larger than the opposing substrate 20, and both substrates are joined via a sealing material 14 which is disposed along the outer periphery of the opposing substrate 20, and configure the liquid crystal layer 15 by enclosing the liquid crystal which has dielectric anisotropy in the gap between both substrates. For example, the sealing material 14 adopts an adhesive such as thermosetting or ultraviolet-curable epoxy resin. A capping material for maintaining the gap between the pair of substrates to be constant is mixed into the sealing material 14.

There is a display region E in which a plurality of pixels P are arranged inside the sealing material 14. A light-shielding layer 18 (parting section) which is made from, for example, metal, metal oxide, or the like with a light-shielding property so as to surround the display region E is disposed between the sealing material 14 and the display region E. Here, the display region E may include a plurality of dummy pixels which are disposed so as to surround the plurality of pixels P which contribute to display.

A data line driving circuit 22 is provided between one side section of the first substrate 10a and the sealing material 14 along the one side section. In addition, an inspection circuit (not shown in the drawings) is provided inside the sealing material 14 along another one side section which faces the one side section. Furthermore, two scanning line driving circuits 24 are provided on another two side sections which face each other and are orthogonal to the one side section. A plurality of wirings 29 which connect the two scanning line driving circuits 24 are provided on the other one side section which faces the one side section.

The wirings which connect the data line driving circuit 22 and the scanning line driving circuits 24 are connected to a plurality of external connection terminals 61 that are arranged along the one side section. Hereafter, the direction along the one side section is described as an X direction, and the direction along the other two side sections which face each other orthogonal to the one side section is described as a Y direction.

As shown in FIG. 2, a pixel electrode 27 which has light permeability that is provided in each pixel P and a thin film transistor 30 (hereinafter, referred to as a "TFT 30") as the switching element, a signal wiring, and a first orientation film 28 which covers these are formed on front surface on the liquid crystal layer 15 side of the first substrate 10a. For example, the pixel electrode 27 is made from a transparent conductive film of indium tin oxide (ITO) or the like.

The light-shielding layer 18, an insulation layer 13 which is formed so as to cover the light-shielding layer 18, a common electrode 31 which is provided so as to cover the insulation layer 13, and a second orientation film 32 which covers the common electrode 31 are provided on the front surface on the liquid crystal layer 15 side of the second substrate 20a.

In the same manner as the pixel electrode 27, the common electrode 31 is made from, for example, a transparent conductive film such as ITO and covers the insulation layer or the like, and is electrically connected to a wiring on the element substrate 10 side by a vertical conduction section 26 which is provided in four corners of the opposing substrate 20 as shown in FIG. 1.

The first orientation film 28 which covers the pixel electrode 27 and the second orientation film 32 which covers the common electrode 31 are inorganic orientation films, and are selected based on an optical design of the liquid crystal device 100. For example, there are examples of substantially vertical orientation with respect to liquid crystal molecules due to formation of an inorganic material such as silicon oxide (SiOx) using a vapor-phase growth method.

Such a liquid crystal device 100 is a transmissive type, and adopts an optical design of a normally black mode in which the pixels P are displayed dark at the time of non-driving, or a normally white mode in which the pixels P are displayed bright at the time of non-driving. According to the optical design, a polarization plate is used by being disposed on an incident side (emission side) of light.

As shown in FIG. 3, the liquid crystal device 100 has a plurality of scanning lines 3a and a plurality of data lines 6a which are orthogonal to and insulated from each other in at least the display region E, and a capacitance line 3b which extends in parallel to the scanning lines 3a. The direction in which the scanning lines 3a extend is the X direction, and the direction in which the data lines 6a extend is the Y direction. Here, the capacitance lines 3b are disposed so as to extend in parallel to the data lines 6a.

The pixel electrode 27, the TFT 30, and a capacitative element 16 are provided in a region which is divided according to the signal line type of the scanning lines 3a and the capacitance lines 3b as well as the data lines 6a, and these configure a pixel circuit of the pixels P.

The scanning lines 3a are electrically connected to a gate of the TFT 30, and the data lines 6a are electrically connected to a TFT 30 data line side source and drain region. The pixel electrode 27 is electrically connected to a TFT 30 pixel electrode side source and drain region.

The data lines 6a are connected to the data line driving circuit 22 (refer to FIG. 1), and image signals D1, D2, . . . , Dn which are supplied from the data line driving circuit 22 are supplied to the pixels P. The scanning lines 3a are connected to the scanning line driving circuit 24 (refer to FIG. 1), and scanning signals SC1, SC2, . . . , SCm which are supplied from the scanning line driving circuit 24 are supplied to each pixel P.

The image signals D1 to Dn which are supplied from the data line driving circuit 22 to the data lines 6a may be supplied in order in line order, and may be supplied in groups with respect to each of the plurality of data lines 6a which are adjacent to each other. The scanning line driving circuit 24 supplies the scanning signals SC1 to SCm with respect to the scanning lines 3a at a predetermined timing in line order in a pulsed manner.

The liquid crystal device 100 is configured to write the image signals D1 to Dn which are supplied from the data lines 6a to the pixel electrode 27 at a predetermined timing by the TFT 30 which is a switching element being set in an ON state for only a certain period due to the input of the scanning signals SC1 to SCm. Then, the image signals D1 to Dn of a predetermined level which are written to the liquid crystal layer 15 via the pixel electrode 27 are held for a certain period within the common electrode 31 that is disposed in opposition via the pixel electrode 27 and the liquid crystal layer 15.

Since the held image signals D1 to Dn are prevented from leaking, the capacitative element 16 is connected in parallel to a liquid crystal capacitor which is formed between the pixel electrode 27 and the common electrode 31. The capacitative element 16 is provided between the capacitance line 3b and the TFT 30 pixel electrode side source and drain region.

Liquid Crystal Device Pixel Structure

Figure 4:
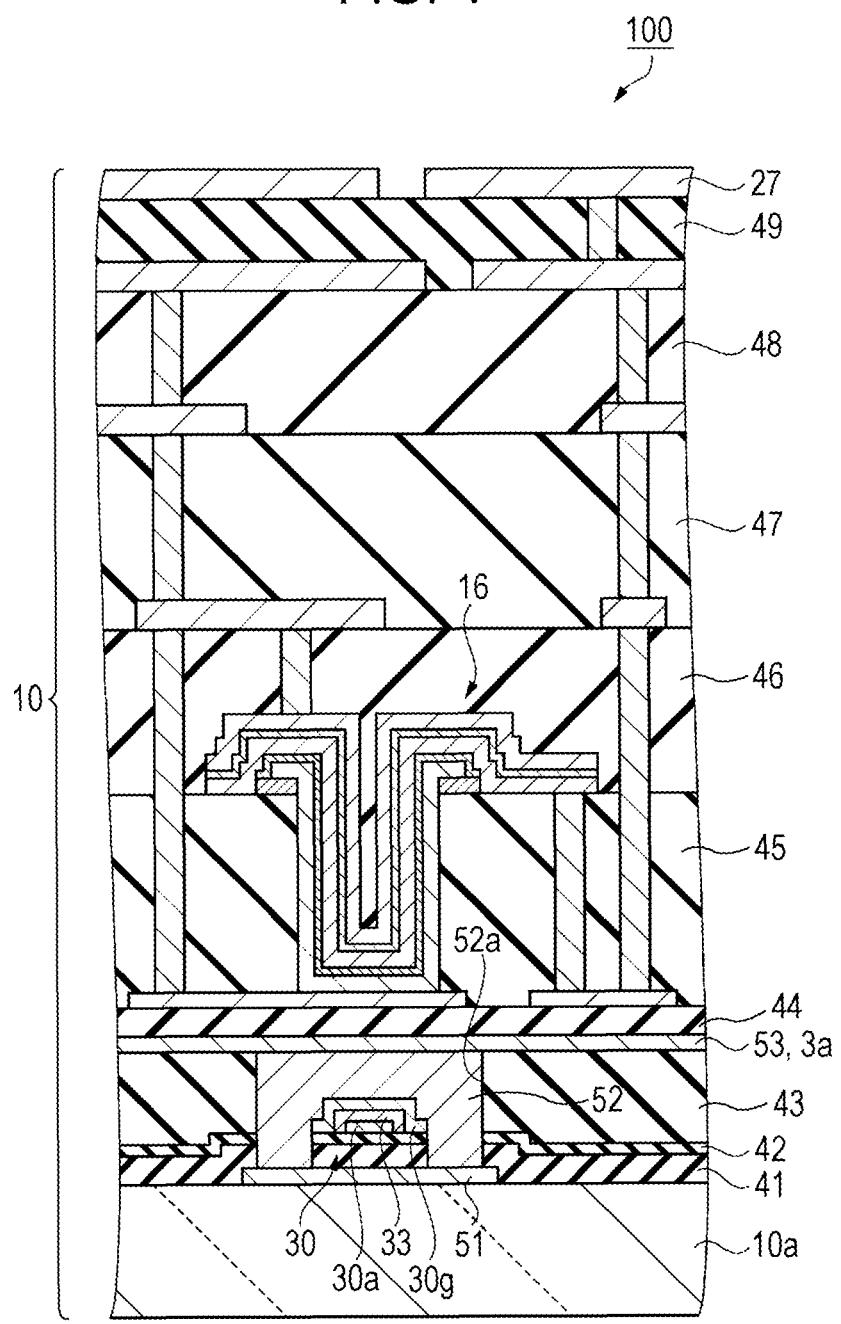
FIG. 4 is an outline sectional view illustrating a structure of a pixel of the liquid crystal device.
Figure 5:
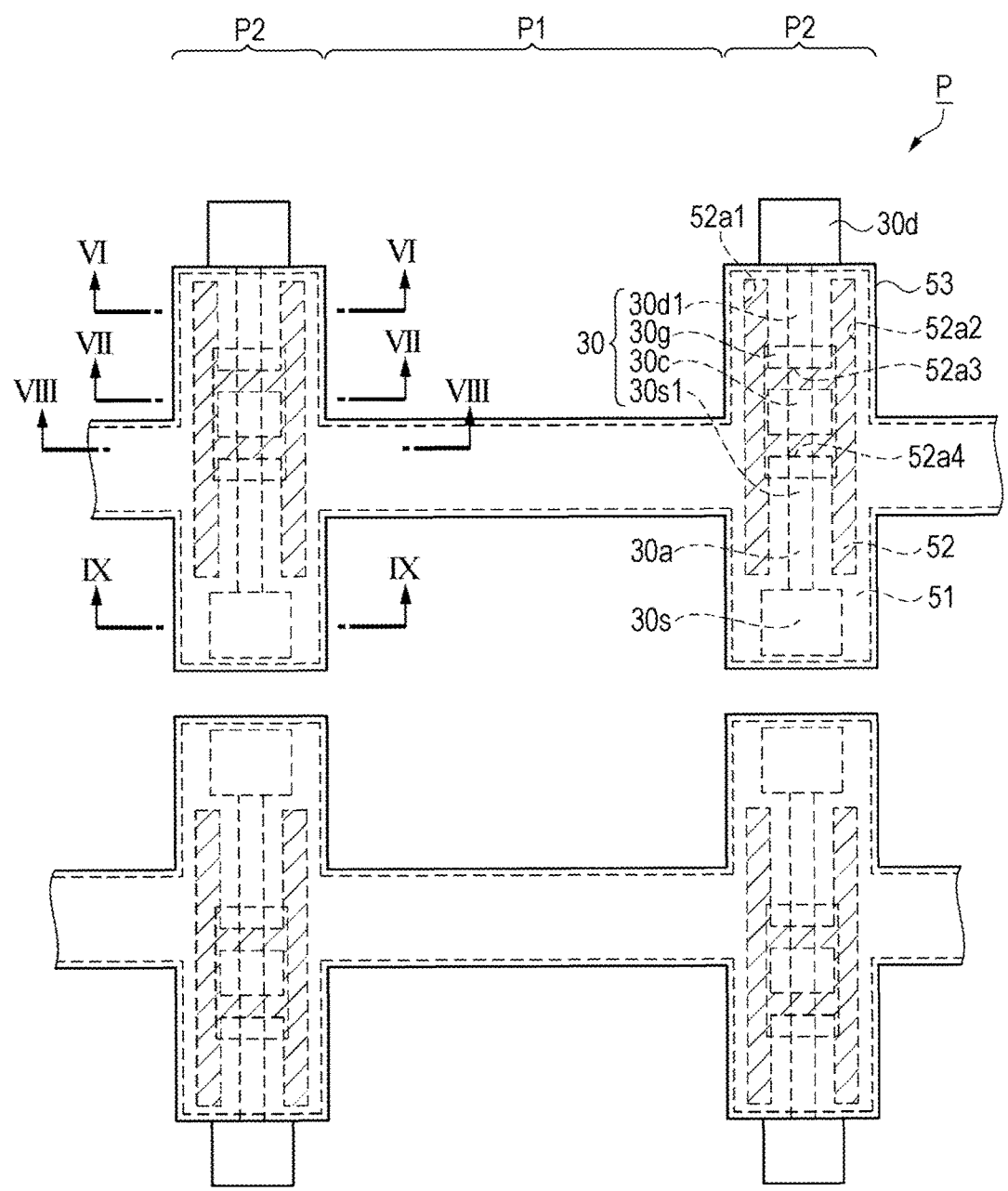
FIG. 5 is an outline perspective view illustrating a structure of the pixel.
Figure 6:
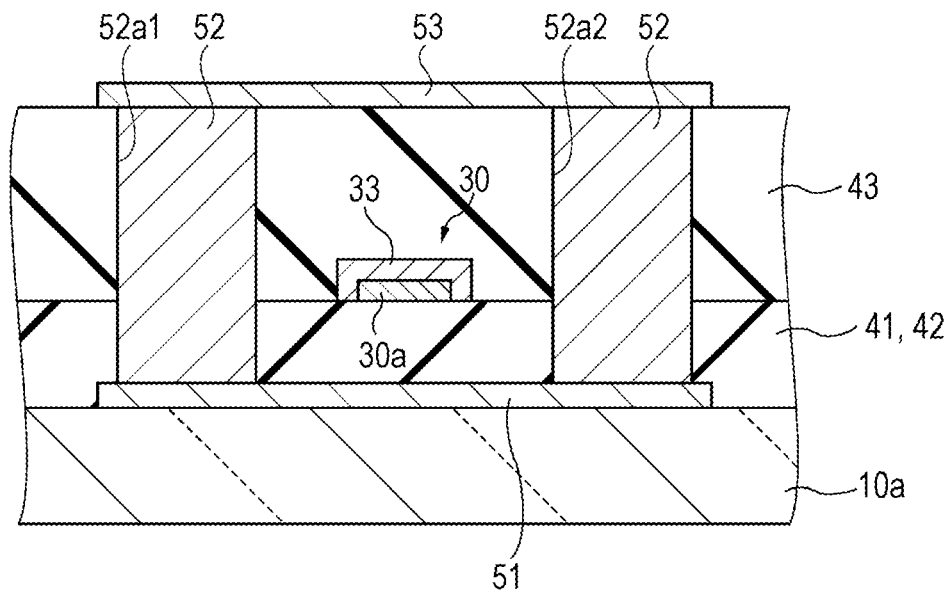
FIG. 6 is an enlarged sectional view along line VI-VI of the pixel which is illustrated in FIG. 5.
Figure 7:
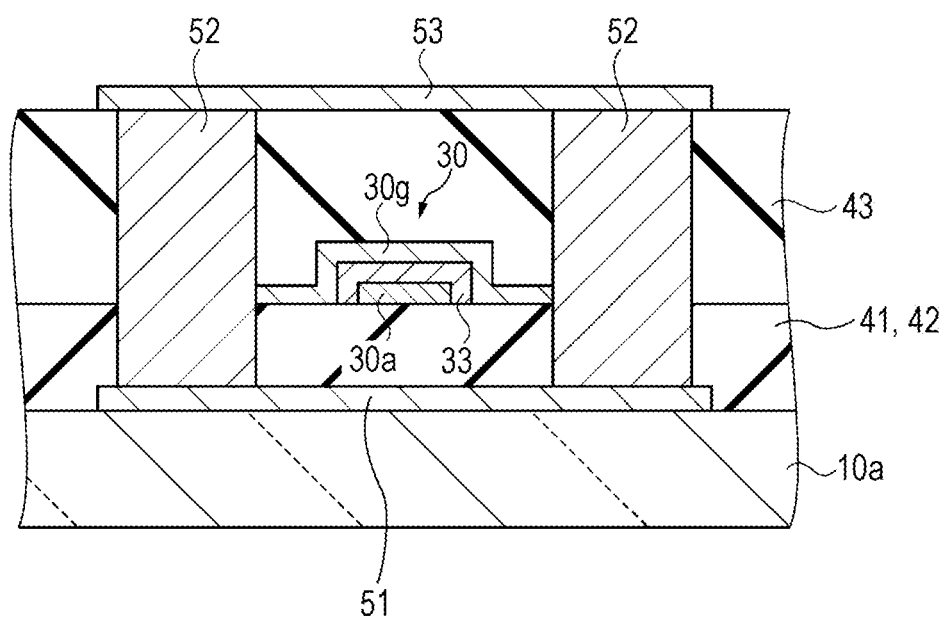
FIG. 7 is an enlarged sectional view along line VII-VII of the pixel which is illustrated in FIG. 5.
Figure 8:
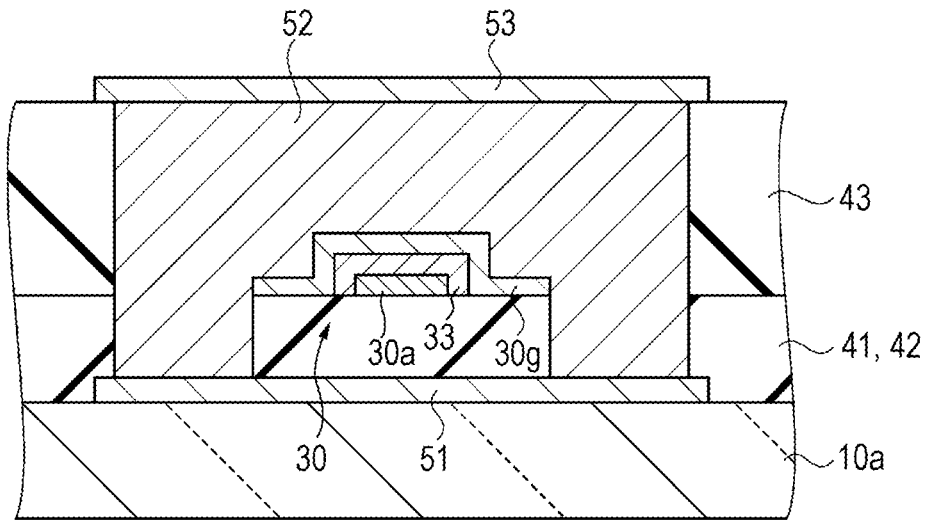
FIG. 8 is an enlarged sectional view along line VIII-VIII of the pixel which is illustrated in FIG. 5.
Figure 9:
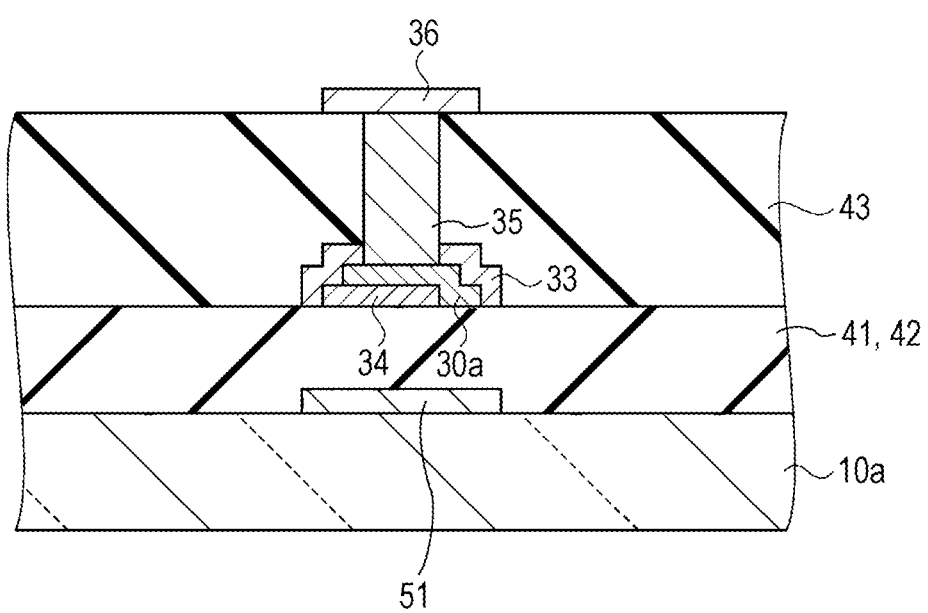
FIG. 9 is an enlarged sectional view along line IX-IX of the pixel which is illustrated in FIG. 5.

FIG. 4 is an outline sectional view illustrating a structure of the pixel of the liquid crystal device. FIG. 5 is an outline perspective view illustrating a structure of the pixel. FIG. 6 is an enlarged sectional view along line VI-VI of the pixel which is illustrated in FIG. 5. FIG. 7 is an enlarged sectional view along line VII-VII of the pixel which is illustrated in FIG. 5. FIG. 8 is an enlarged sectional view along line VIII-VIII of the pixel which is illustrated in FIG. 5. FIG. 9 is an enlarged sectional view along line IX-IX of the pixel which is illustrated in FIG. 5. The structure of the pixel will be described below with reference to FIGS. 4 to 9. Here, FIGS. 4 to 9 show planar or sectional positional relationships of each configuration element, and are represented using presentable measures.

As shown in FIG. 4, the liquid crystal device 100 is provided with the element substrate 10, and the opposing substrate 20 (refer to FIG. 2) which is disposed to face the element substrate 10. As shown above, the first substrate 10a which configures the element substrate 10 is, for example, configured by a quartz substrate or the like.

For example, a first light-shielding film 51 (first light-shielding member) which is made from tungsten (W), tungsten silicide (WSi), or the like is formed on the first substrate 10a. The first light-shielding film 51 is patterned in a grid pattern in planar view, and regulates an opening region of each pixel P. The first light-shielding film 51 has conductivity, and functions as a portion of the scanning lines 3a. A first insulation layer 41 and a second insulation layer 42 which are made from silicon oxide or the like are formed on the first substrate 10a and the first light-shielding film 51.

The TFT 30, the scanning lines 3a (a third light-shielding film 53 (third light-shielding member)), and the like are formed on the second insulation layer 42. For example, the TFT 30 has an LDD structure, and has a semiconductor layer 30a which is made from amorphous silicon (a-Si) or the like, a gate insulation film 33 which is formed on the semiconductor layer 30a, and a gate electrode 30g which is made from polysilicon or the like that is formed on the gate insulation film 33.

In detail, the semiconductor layer 30a is provided with a channel region 30c, a data line side LDD region 30s1, a data line side source and drain region 30s, a pixel electrode side LDD region 30d1, and a pixel electrode side source and drain region 30d (refer to FIG. 5 for all).

A third insulation layer 43 which is made from silicon oxide or the like is formed on the gate electrode 30g and the second insulation layer 42. The third light-shielding film 53 which is used as the scanning lines 3a is provided on the third insulation layer 43.

In addition, a groove 52a which passes through from the first light-shielding film 51 to the third light-shielding film 53 is provided in the periphery of the TFT 30 on the first light-shielding film 51. The second light-shielding film 52 (second light-shielding member) which is made from tungsten (W) or the like is embedded within the groove 52a. In other words, the third light-shielding film 53 (scanning lines 3a), the gate electrode 30g, and the first light-shielding film 51 are electrically connected by the second light-shielding film 52.

That is, at least a portion of the periphery of the TFT 30 is able to be concealed by the first light-shielding film 51, the second light-shielding film 52, and the third light-shielding film 53. By setting in this manner, it is possible to shield light from light leakage even in a case where light leakage is generated from a portion (for example, the LDD region) of the semiconductor layer 30a which configures the TFT 30.

Insulation layers (44 to 49), the capacitative element 16, a wiring, a relay electrode, the pixel electrode 27, and the like are provided on the third light-shielding film 53. Here, the capacitative element 16 is configured such that a dielectric film is interposed between a pair of capacitative electrodes. Here, detailed description is omitted.

The pixel electrode 27 is connected to a portion of the capacitative element 16, and although not illustrated, is electrically connected to the pixel electrode side source and drain region 30d (drain region) of the semiconductor layer 30a.

The first orientation film 28 (refer to FIG. 2) which obliquely evaporates a non-organic material such as silicon oxide (SiO$_2$) is provided on the insulation layer (49) between the pixel electrode 27 and the adjacent pixel electrode 27. The liquid crystal layer 15 which is enclosed by liquid crystal or the like in a space that is surrounded by the sealing material 14 (refer to FIGS. 1 and 2) is provided on the first orientation film 28. The opposing substrate 20 (refer to FIG. 2) is disposed so as to face the element substrate 10 on the liquid crystal layer 15.

Next, in particular, a light shielding structure of the periphery of the TFT 30 will be described with reference to FIGS. 5 to 9. FIG. 5 is an outline perspective view viewing the first substrate 10a side from the third light-shielding film 53.

As shown in FIG. 5, the pixel P has an opening region P1 and a light shielding region P2 which is on the periphery of the opening region P1. The pixel P which is illustrated in FIG. 5 is formed by the semiconductor layer 30a so as to overlap with the first light-shielding film 51 which is formed in the light shielding region P2.

One end and another end of the semiconductor layer 30a are the source and drain regions 30s and 30d. The gate electrode 30g is disposed in the region which overlaps with the channel region 30c of the semiconductor layer 30a.

In addition, a first groove 52a1 which passes through from the first light-shielding film 51 to the third light-shielding film 53 is formed on one side to interpose the semiconductor layer 30a. In the same manner, a second groove 52a2 which passes through from the first light-shielding film 51 to the third light-shielding film 53 is formed on the other side to interpose the semiconductor layer 30a. In addition, a third groove 52a3 and a fourth groove 52a4 are formed so as to span from the first groove 52a1 to the second groove 52a2. In other words, the first groove 52a1 to the fourth groove 52a4 are ladder shaped in planar view.

The reason that the two grooves (third groove 52a3 and fourth groove 52a4) are formed in a ladder shape is in order for a potential of the scanning line 3a (third light-shielding film 53) to be transmitted to the gate electrode 30g even in a case where misalignment of a mask or the like occurs. In addition, it is possible for contact resistance to drop due to the ladder shape.

The third groove 52a3 and the fourth groove 52a4 are formed so as to pass through from the gate electrode 30g of the TFT 30 to the third light-shielding film 53. Then, the second light-shielding film 52 which is made from tungsten or the like is embedded in the first groove 52a1, the second groove 52a2, the third groove 52a3, and the fourth groove 52a4. Here, the material of the third light-shielding film 53 is aluminum which has a higher light-shielding property than the tungsten of the second light-shielding film 52.

The third light-shielding film 53 is formed with substantially the same form as the first light-shielding film 51 on the second light-shielding film 52. Next, the structure of the pixel P will be described while viewing a cross-section.

FIG. 6 is an enlarged sectional view along line VI-VI of the light shielding region P2 which is illustrated in FIG. 5. The second light-shielding film 52 which is embedded in the first groove 52a1 and the second groove 52a2 that pass through from the first light-shielding film 51 to the third light-shielding film 53 is formed on the first light-shielding film 51. In addition, the first insulation layer 41 and the second insulation layer 42 are formed on the first light-shielding film 51.

The semiconductor layer 30a and the gate insulation film 33 which covers the semiconductor layer 30a are formed on the second insulation layer 42. The third insulation layer 43 is formed on the second insulation layer 42 and the gate insulation film 33.

In this manner, the periphery of the semiconductor layer 30a is able to shield light using the first light-shielding film 51, the second light-shielding film 52, and the third light-shielding film 53.

FIG. 7 is an enlarged sectional view along line VII-VII of the light shielding region P2 which is illustrated in FIG. 5. In the same manner as FIG. 6, the second light-shielding film 52 which is embedded in the first groove 52a1 and the second groove 52a2 that pass through from the first light-shielding film 51 to the third light-shielding film 53 is formed on the first light-shielding film 51. In addition, the first insulation layer 41 and the second insulation layer 42 are formed on the first light-shielding film 51.

The semiconductor layer 30a and the gate insulation film 33 which covers the semiconductor layer 30a are formed on the second insulation layer 42. The gate electrode 30g is formed on the second insulation layer 42 and the gate insulation film 33. The third insulation layer 43 is formed on the gate electrode 30g.

In this manner, the periphery of the semiconductor layer 30a is able to shield light using the first light-shielding film 51, the second light-shielding film 52, and the third light-shielding film 53, and the gate electrode 30g, the first light-shielding film 51, and the third light-shielding film 53 are electrically connected via the second light-shielding film 52.

FIG. 8 is an enlarged sectional view along line VIII-VIII of the light shielding region P2 which is illustrated in FIG. 5. In the same manner as FIG. 6, the second light-shielding film 52 which is embedded in the first groove 52a1 and the second groove 52a2 that pass through from the first light-shielding film 51 to the third light-shielding film 53 is formed on the first light-shielding film 51. In addition, the first insulation layer 41 and the second insulation layer 42 are formed on the first light-shielding film 51.

The semiconductor layer 30a and the gate insulation film 33 which covers the semiconductor layer 30a are formed on the second insulation layer 42. In the same manner as FIG. 7, the gate electrode 30g is formed on the second insulation layer 42 and the gate insulation film 33.

Here, the second light-shielding film 52 which is embedded in the third groove 52a3 and the fourth groove 52a4 that pass through from the gate electrode 30g to the third light-shielding film 53 is formed on the gate electrode 30g. That is, the first groove 52a1, the second groove 52a2, the third groove 52a3, and the fourth groove 52a4 are embedded without a gap using the second light-shielding film 52.

In this manner, the periphery of the semiconductor layer 30a is able to shield light using the first light-shielding film 51, the second light-shielding film 52, and the third light-shielding film 53, and the gate electrode 30g, the first light-shielding film 51, and the third light-shielding film 53 are electrically connected via the second light-shielding film 52.

FIG. 9 is an enlarged sectional view along line IX-IX of the light shielding region P2 which is illustrated in FIG. 5. The first insulation layer 41 and the second insulation layer 42 are formed on the first light-shielding film 51. A pad 34, the semiconductor layer 30a which extends on the pad 34, and the gate insulation film 33 which covers the semiconductor layer 30a are formed on the second insulation layer 42.

The third insulation layer 43 is formed on the gate insulation film 33 and the second insulation layer 42. A relay electrode 36 which is electrically connected to the semiconductor layer 30a (source and drain region) is formed on the third insulation layer 43 via a contact hole 35 (first contact hole and second contact hole) which passes through the third insulation layer 43 and the gate insulation film 33.

In this manner, since a film which is made from tungsten or the like is embedded in the contact hole 35 that passes through from the semiconductor layer 30a to the relay electrode 36 which is substantially the same layer as the third light-shielding film 53 on the one side and the other side of the semiconductor layer 30a, it is possible to suppress light leakage from leaking in the extension direction of the first substrate 10a in the semiconductor layer 30a in addition to the second light-shielding film 52.

Liquid Crystal Device Manufacturing Method

Figure 10:
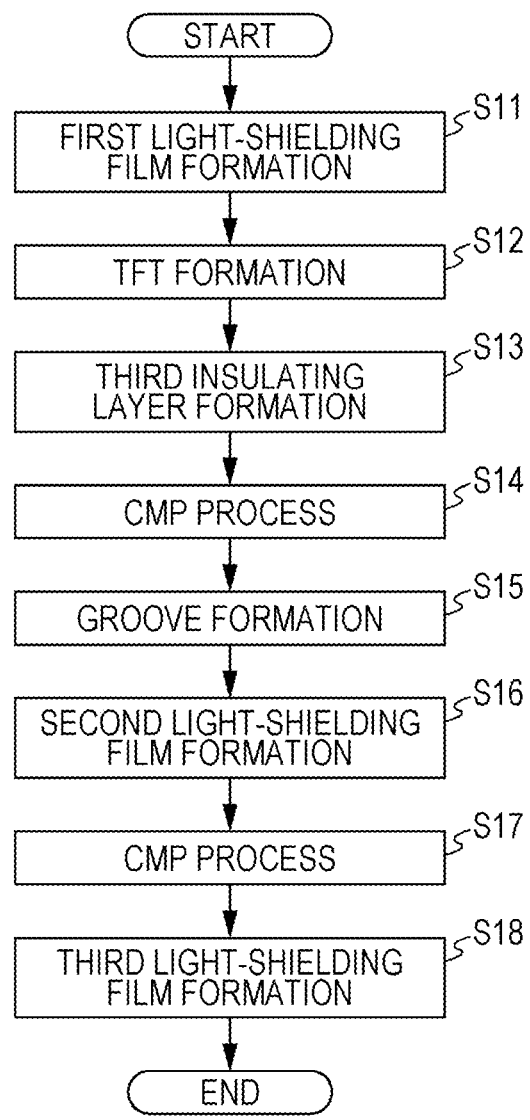
FIG. 10 is a flow chart illustrating a manufacturing method of the liquid crystal device in process order.

FIG. 10 is a flow chart illustrating a manufacturing method of the liquid crystal device in process order. FIGS. 11A to 11D and 12E to 12H are outline sectional views illustrating a manufacturing method of a portion of the manufacturing method of the liquid crystal device. The manufacturing method of the liquid crystal device will be described below with reference to FIGS. 10 to 12H. Here, description of the manufacturing method of the contact holes which are connected to the source and drain is omitted. In addition, the manufacturing method of the element substrate which is the main component of the liquid crystal device will be described.

Figure 11A:
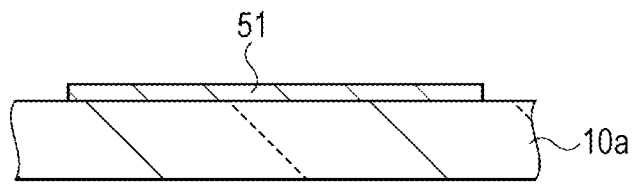
FIGS. 11A to 11D are outline sectional views illustrating a manufacturing method of a portion of the manufacturing method of the liquid crystal device.

As shown in FIG. 10, the first light-shielding film 51 is formed in step S11. In detail, as shown in FIG. 11A, for example, tungsten silicide (WSi) is formed on the first substrate 10a which is made from a quartz substrate or the like. As the manufacturing method, it is possible to use the known film forming technique, the photolithography technique, and the etching technique. The film thickness of the first light-shielding film 51 is, for example, 200 nm.

Figure 11B:
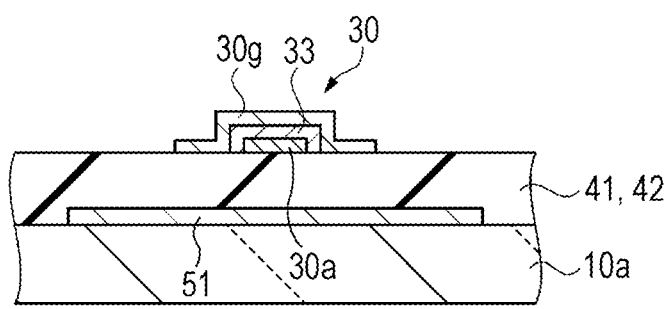

Next, the TFT 30 is formed in step S12. In detail, as shown in FIG. 11B, first, the first insulation layer 41 and the second insulation layer 42 which are made from silicon oxide ($SiO_2$) are formed on the first light-shielding film 51 using the known film forming technique. After this, the TFT 30 is formed on the second insulation layer 42. As the manufacturing method of the TFT 30, it is possible to use the known film forming technique, the photolithography technique, and the etching technique.

For example, the semiconductor layer 30a which configures the TFT 30 is an amorphous silicon (a-Si). For example, the thickness of the semiconductor layer 30a is 55 nm.

For example, the gate electrode 30g is a two layer laminated film, and is formed by polysilicon on the gate insulation film 33 side and tungsten silicide on the front surface side. For example, the film thickness of the polysilicon is 600 Å. For example, the film thickness of the tungsten silicide is 600 Å.

Figure 11C:
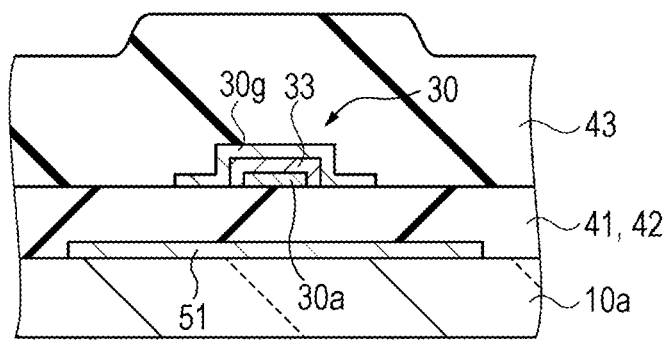

Next, the third insulation layer 43 is formed in step S13. In detail, as shown in FIG. 11C, the third insulation layer 43 which is made from silicon oxide or the like is formed on the gate electrode 30g and the second insulation layer 42 using the known film forming technique. The front surface of the third insulation layer 43 is formed in a convex shape caused by undulation of the TFT 30 or the like which is formed on a lower layer.

Figure 11D:
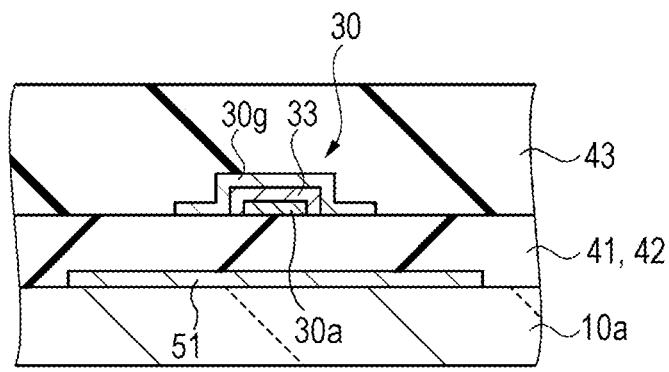

Next, a chemical mechanical polishing (CMP) process is carried out in step S14. In detail, as shown in FIG. 11D, the CMP process is carried out on the front surface of the third insulation layer 43, and the front surface is flattened.

Figure 12E:
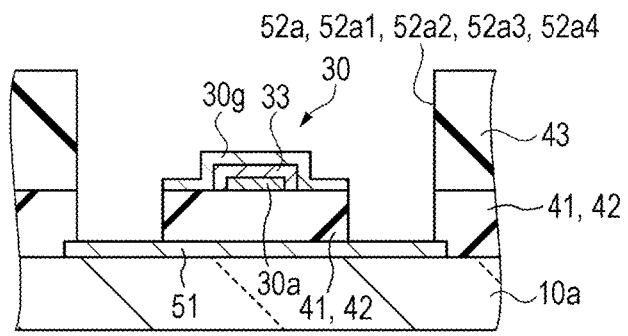
FIGS. 12E to 12H are outline sectional views illustrating a manufacturing method of a portion of the manufacturing method of the liquid crystal device.

Next, the groove 52a is formed in step S15. In detail, as shown in FIG. 12E, the first groove 52a1, the second groove 52a2, the third groove 52a3, and the fourth groove 52a4 are formed on the third insulation layer 43, the second insulation layer 42, and the first insulation layer 41. As the manufacturing method, the photolithography technique and the etching technique may be used for forming.

Thereby, the bottom of the first groove 52a1 and the second groove 52a2 is exposed by the first light-shielding film 51. In addition, the bottom of the third groove 52a3 and the fourth groove 52a4 is exposed by the gate electrode 30g. Here, for example, the groove width of the first groove 52a1 to the fourth groove 52a4 is 0.2 µm. For example, the maximum width of the groove width is 0.5 µm.

Figure 12F:
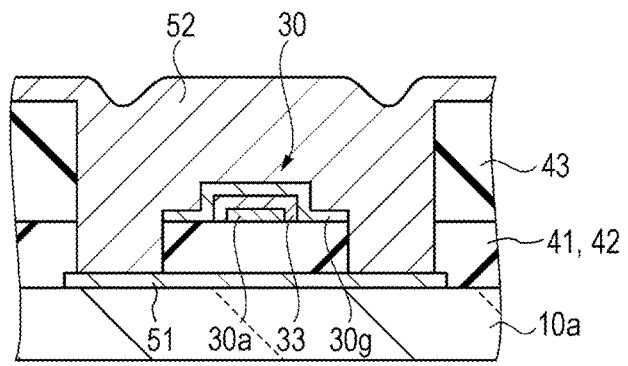

Next, the second light-shielding film 52 is formed in step S16. In detail, as shown in FIG. 12F, tungsten (W) is grown and embedded without a gap within the first groove 52a1 to the fourth groove 52a4. Thereby, the front surface of the second light-shielding film 52 has an uneven shape caused by the undulation of the TFT 30 on the lower layer.

Figure 12G:
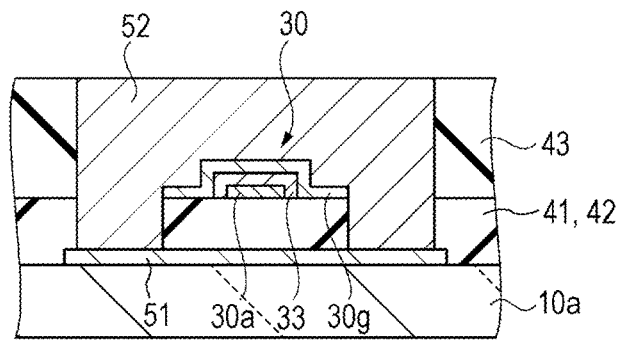

Next, the CMP process is carried out in step S17. In detail, as shown in FIG. 12G, the CMP process is carried out on the front surface of the second light-shielding film 52, and the front surface is flattened. Here, for example, the depth of the second light-shielding film 52 is 8000 Å.

Figure 12H:
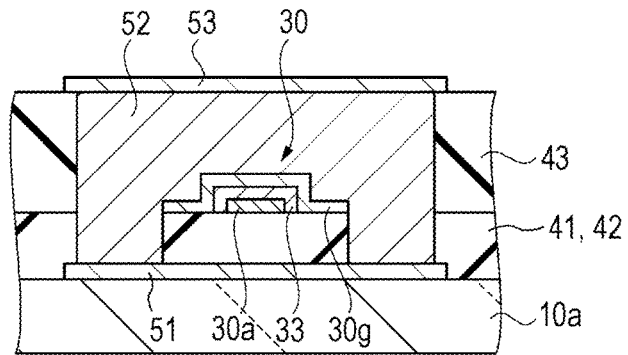

Next, the third light-shielding film 53 is formed in step S18. In detail, as shown in FIG. 12H, the third light-shielding film 53 which is made from aluminum or the like is formed on the second light-shielding film 52 and the third insulation layer 43. As the manufacturing method, it is possible to use the known film forming technique, the photolithography technique, and the etching technique. It is possible to use the third light-shielding film 53 as the scanning line 3*a*.

After this, the pixel electrode 27 is formed on the third light-shielding film 53 via the plurality of insulation layers. Next, the first orientation film 28 is formed using an oblique deposition method so as to cover the pixel electrode 27 and the like. As described above, the element substrate 10 side is completed (refer to FIG. 4).

Configuration of Electronic Apparatus

Figure 13:
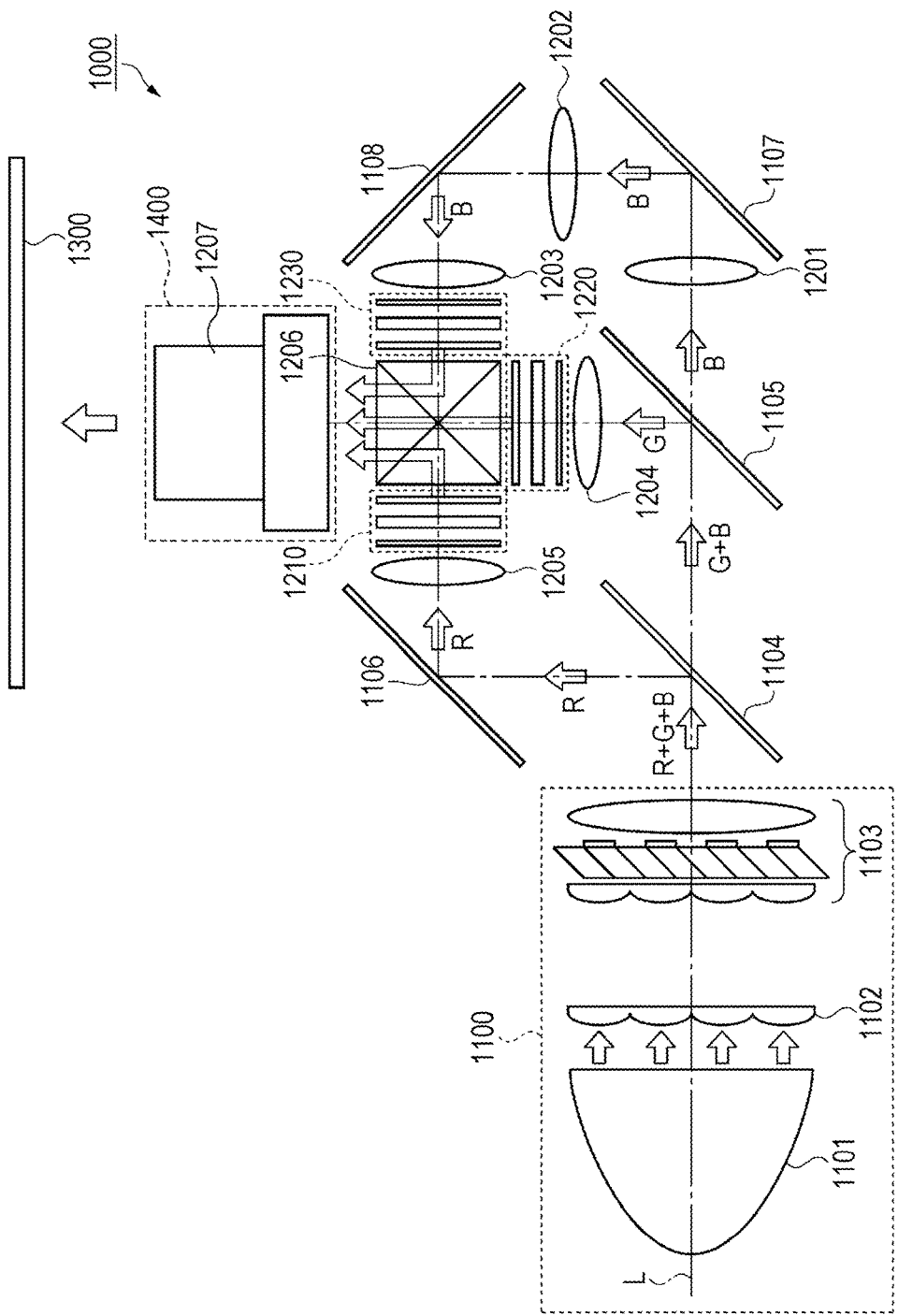
FIG. 13 is a schematic view illustrating a configuration of a projector as an electronic apparatus.
Figure 14:
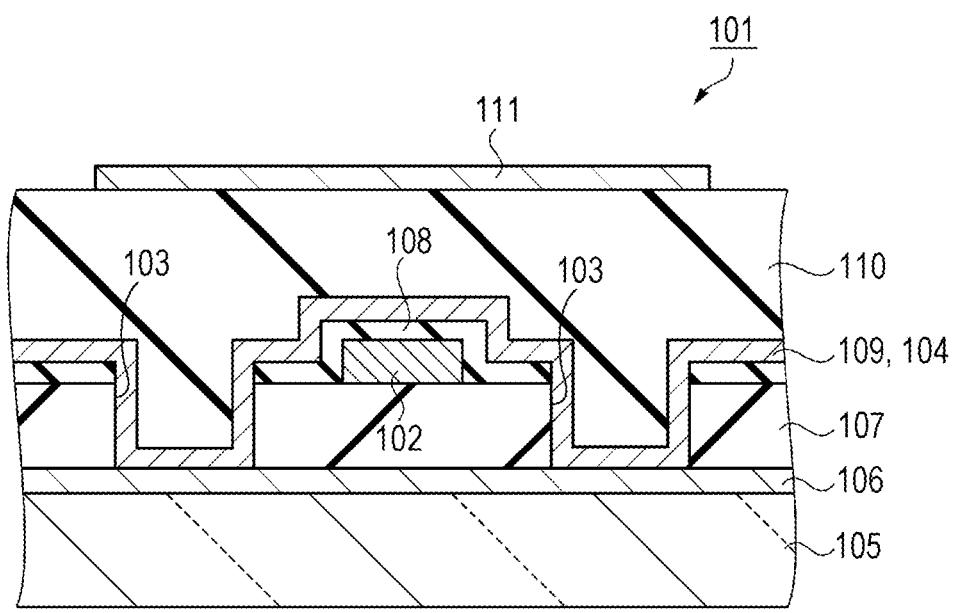
FIG. 14 is an outline sectional view illustrating a configuration of a liquid crystal device of the related art.

FIG. 13 is a schematic view illustrating a configuration of a projector as an electronic apparatus. The configuration of the projector will be described below with reference to FIG. 13.

As shown in FIG. 13, a projector 1000 of the embodiment is provided with a polarized light illumination device 1100 as an illumination system which is disposed along a system optical axis L, two dichroic mirrors 1104 and 1105 as light separation elements, three reflective mirrors 1106, 1107, and 1108, five relay lenses 1201, 1202, 1203, 1204, and 1205, transmissive type liquid crystal light valves 1210, 1220, and 1230 as three light modulation means, a cross dichroic prism 1206 as a light-combining element, and a projection lens 1207.

The polarized light illumination device 1100 is configured in outline from a lamp unit 1101 as a light source made from a white light source such as an ultra-high pressure mercury lamp or a halogen lamp, an integrator lens 1102, and a polarization conversion element 1103.

The dichroic mirror 1104 reflects red light (R), and transmits green light (G) and blue light (B) out of polarized light beams which are emitted from the polarized light illumination device 1100. The other dichroic mirror 1105 reflects the green light (G) which passes through the dichroic mirror 1104, and transmits the blue light (B).

The red light (R) which is reflected by the dichroic mirror 1104 is incident to the liquid crystal light valve 1210 via the relay lens 1205 after being reflected by the reflective mirror 1106. The green light (G) which is reflected by the dichroic mirror 1105 is incident to the liquid crystal light valve 1220 via the relay lens 1204. The blue light (B) which is transmitted by the dichroic mirror 1105 is incident to the liquid crystal light valve 1230 via a light guide system that is made from three relay lenses 1201, 1202, and 1203, and two reflective mirrors 1107, and 1108.

The liquid crystal light valves 1210, 1220, and 1230 are disposed facing respective incident surfaces of each color of light of the cross dichroic prism 1206. The color of light which is incident to the liquid crystal light valves 1210, 1220, and 1230 is emitted toward the cross dichroic prism 1206 that modulates based on moving image information (a moving image signal).

The prism is four rectangular prisms bonded together, and a dielectric multilayer film which reflects the red light on the inner surface of the prism and a dielectric multilayer film which reflects the blue light are formed in a cross shape. The dielectric multilayer films combine light which represents a color image by combining the three colors of light. The combined light is projected on a screen 1300 by the projection lens 1207 which configures a projection optical system 1400, and is displayed by enlarging the image.

The liquid crystal light valve 1210 is applied by the liquid crystal device 100 which will be described later. The liquid crystal device 100 is disposed in a gap between a pair of polarization elements that are in a cross Nicol disposition on the incidence side and the emission side of the color light. The other liquid crystal light valves 1220 and 1230 are the same.

As described above in detail, according to the liquid crystal device 100 and the projector 1000 of the embodiment, the effects which are illustrated below are obtainable.

(1) According to the liquid crystal device 100 of the embodiment, since the semiconductor layer 30*a* is surrounded by the first light-shielding film 51, the second light-shielding film 52, and the third light-shielding film 53, it is possible to suppress emission to the outside of light leakage from the semiconductor layer 30*a*. In addition, the second light-shielding film 52 is embedded in the groove 52*a*, and since there is no gap, it is possible to increase the light-shielding property in comparison to a case where the light-shielding film is formed only on the side wall of the groove 52*a*. In addition, since there is no gap within the groove 52*a*, it is possible to suppress occurrence of stray light. Additionally, since the third light-shielding film 53 is electrically connected to the gate electrode 30*g* and the first light-shielding film 51 via the second light-shielding film 52, it is possible to operate the TFT 30, and it is possible for a portion of the periphery of at least the semiconductor layer 30*a* to completely shield light from light leakage using the first light-shielding film 51, the second light-shielding film 52, and the third light-shielding film 53. Additionally, it is possible to miniaturize the liquid crystal device 100 using the light shielding structure described above.

(2) According to the liquid crystal device 100 of the embodiment, since aluminum is used as the third light-shielding film 53, it is possible to increase the light-shielding property, and it is possible to suppress emission of light leakage to the liquid crystal layer 15 side. Furthermore, since tungsten with a high embedding property is grown to be formed as the second light-shielding film 52, it is possible to form the tungsten within the groove 52*a* without a gap. Consequently, it is possible to improve the light-shielding property of the second light-shielding film 52. In addition, since the third light-shielding film 53 is disposed on the second light-shielding film 52 which grows the tungsten within the groove 52*a*, it is possible to shorten a distance from the semiconductor layer 30*a* of the embodiment to the third light-shielding film 53 in comparison to a distance from a semiconductor layer of the related art to an upper light-shielding film. Consequently, it is possible to increase the light-shielding property by disposing the third light-shielding film 53 at a close distance from the semiconductor layer 30*a*.

(3) According to the liquid crystal device 100 of the embodiment, since the contact hole 35 which is electrically connected to the source and drain region and is embedded with tungsten is disposed on both ends of the extension direction of the semiconductor layer 30*a*, it is possible to shield light of a portion in which it is not possible to shield light using the first light-shielding film 51 to the third light-shielding film 53 (the extension direction of the semiconductor layer 30a). Consequently, it is possible to suppress light leakage entering into the opening region P1 of the pixel. As a result, it is possible to improve the display quality.

(4) According to the projector 1000 of the embodiment, since the liquid crystal device 100 which is described above is provided, it is possible to provide the projector 1000 which is able to suppress light leakage, and display with high quality.

Here, the aspects of the invention are not limited to the embodiments described above, and are able to be appropriately modified within a range that does not depart from the gist or spirit of the invention which is read from the claims and the entire specification, and is included in the technical range of the aspect of the invention. In addition, it is also possible to implement the following forms.

Modification Example 1

The invention is not limited to the disposition of the third light-shielding film 53 not being connected to any wiring above the TFT 30 as shown in FIGS. 6 to 8, and for example, as shown in FIG. 4, may be connected to the scanning line. Thereby, since aluminum is used as the third light-shielding film 53 (scanning line), it is possible increase writing speed (it is possible to establish a write margin) even in a case where it is possible to reduce electrical resistance and there are a large number of pixels.

Modification Example 2

As described above, the form of the contact hole 35 which is electrically connected to the source and drain regions 30s and 30d is not limited to a substantially square shape (refer to FIG. 5), and for example, may be formed in an oblong form such as a rectangle. In detail, the form of the contact hole 35 is formed so as to become long in a direction which intersects with the extension direction of the semiconductor layer 30a. Thereby, it is possible to surround a portion which is not surrounded by the second light-shielding film 52, and it is possible to shield light from light leakage using the contact hole 35.

Modification Example 3

The invention is not limited to application to the liquid crystal device 100 as the electro-optical apparatus as described above, and for example, may be applied to an apparatus which has an element or the like in which light leakage is generated.

Modification Example 4

The invention is not limited to the side wall of the second light-shielding film 52 which is made from tungsten or the like extending straight up as described in FIG. 7, and for example, a portion of the side wall on the TFT side may be formed so as to encroach on the TFT side. In other words, the thickness of the second light-shielding film 52 is different on the lower section and the upper section. Thereby, it is possible to suppress light leakage escaping from a gap of the light-shielding film due to misalignment of a mask or the like.

This application claims priority to Japan Patent Application No. 2015-001532 filed Mar. 31, 2015, the entire disclosure of which is hereby incorporated by reference herein.

What is claimed is:

1. An electro-optical apparatus comprising:
a substrate;
a third light-shielding member which is provided above the substrate;
a transistor which is provided between the third light-shielding member and the substrate;
a first light-shielding member which is provided between the transistor and the substrate; and
a second light-shielding member which is provided within a groove that is provided between the first light-shielding member and the third light-shielding member and electrically connects the first light-shielding member and the third light-shielding member,
wherein the transistor is disposed in the groove.

2. The electro-optical apparatus according to claim 1, wherein the third light-shielding member has a higher light-shielding property than a gate electrode of the transistor and the second light-shielding member.

3. An electronic apparatus comprising:
the electro-optical apparatus according to claim 2.

4. The electro-optical apparatus according to claim 1, wherein the second light-shielding member is formed of tungsten, and
the third light-shielding member is formed of aluminum.

5. The electro-optical apparatus according to claim 4, wherein the third light-shielding member is a scanning line.

6. An electronic apparatus comprising:
the electro-optical apparatus according to claim 4.

7. An electronic apparatus comprising:
the electro-optical apparatus according to claim 5.

8. The electro-optical apparatus according to claim 1, further comprising:
a first contact hole which is electrically connected to one of a source and a drain of the transistor; and
a second contact hole which is electrically connected to the other of the source and the drain,
wherein a height of the first contact hole and the second contact hole is formed up to a height of at least the third light-shielding member.

9. An electronic apparatus comprising:
the electro-optical apparatus according to claim 8.

10. An electronic apparatus comprising:
the electro-optical apparatus according to claim 1.

11. An electro-optical apparatus comprising:
a substrate;
a third light-shielding member which is provided above the substrate;
a transistor which is provided between the third light-shielding member and the substrate;
a first light-shielding member which is provided between the transistor and the substrate; and
a second light-shielding member which is provided within a groove that is provided between the first light-shielding member and the third light-shielding member at least at both sides of the transistor and electrically connects the first light-shielding member and the third light-shielding member,
wherein the second light-shielding member is provided above the transistor and between the third light-shielding member and the transistor.

* * * * *

UNITED STATES PATENT AND TRADEMARK OFFICE
CERTIFICATE OF CORRECTION

| | | |
|---|---|---|
| PATENT NO. | : 9,823,530 B2 | |
| APPLICATION NO. | : 15/060456 | |
| DATED | : November 21, 2017 | |
| INVENTOR(S) | : Yohei Sugimoto | |

It is certified that error appears in the above-identified patent and that said Letters Patent is hereby corrected as shown below:

On the Title Page

Item (30) Insert:
--March 31, 2015   (JP)..................2015-001532U--

Signed and Sealed this
First Day of May, 2018

Andrei Iancu
*Director of the United States Patent and Trademark Office*